(12) United States Patent
Kim et al.

(10) Patent No.: US 11,791,153 B2
(45) Date of Patent: Oct. 17, 2023

(54) DEPOSITION OF HAFNIUM OXIDE WITHIN A HIGH ASPECT RATIO HOLE

(71) Applicant: ASM IP HOLDING B.V., Almere (NL)

(72) Inventors: Jiyeon Kim, Tempe, AZ (US); Petri Raisanen, Gilbert, AZ (US); Sol Kim, Phoenix, AZ (US); Ying-Shen Kuo, Chandler, AZ (US); Michael Schmotzer, Chandler, AZ (US); Eric James Shero, Phoenix, AZ (US); Paul Ma, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 423 days.

(21) Appl. No.: 17/170,742

(22) Filed: Feb. 8, 2021

(65) Prior Publication Data

US 2021/0249263 A1 Aug. 12, 2021

Related U.S. Application Data

(60) Provisional application No. 62/972,568, filed on Feb. 10, 2020.

(51) Int. Cl.
*H01L 21/02* (2006.01)
*H01L 21/768* (2006.01)

(52) U.S. Cl.
CPC .... *H01L 21/02181* (2013.01); *H01L 21/0228* (2013.01); *H01L 21/02244* (2013.01); *H01L 21/76837* (2013.01)

(58) Field of Classification Search
CPC ......... H01L 21/02181; H01L 21/02244; H01L 21/0228; H01L 21/76837; H10B 12/0387
See application file for complete search history.

(56) References Cited

U.S. PATENT DOCUMENTS

| 3,429,903 A | 2/1969 | Larson |
| 3,784,631 A | 1/1974 | Menapace et al. |

(Continued)

FOREIGN PATENT DOCUMENTS

| CN | 101117308 | 2/2008 |
| CN | 101343732 | 1/2009 |

(Continued)

OTHER PUBLICATIONS

Baxter et al., "Chemical vapour deposition of electrochromic tungsten oxide films employing volatile tungsten(vl) 0x0 alkoxide/β-diketonate complexes", Chem. Commun., 1996, pp. 1129-1130.

(Continued)

*Primary Examiner* — Brook Kebede
(74) *Attorney, Agent, or Firm* — Snell & Wilmer L.L.P.

(57) ABSTRACT

Methods for forming hafnium oxide within a three-dimensional structure, such as in a high aspect ratio hole, are provided. The methods may include depositing a first hafnium-containing material, such as hafnium nitride or hafnium carbide, in a three-dimensional structure and subsequently converting the first hafnium-containing material to a second hafnium-containing material comprising hafnium oxide by exposing the first hafnium-containing material to an oxygen reactant. The volume of the second hafnium-containing material may be greater than that of the first hafnium-containing material. Voids or seams formed during the deposition of the first hafnium-containing material in the three-dimensional structure may be filled by the expanded material after exposing the first hafnium-containing material to the oxygen reactant. Thus, the three-dimensional structure, such as a high aspect ratio hole, can be filled with hafnium oxide substantially free of voids or seams.

20 Claims, 2 Drawing Sheets

(56) References Cited

U.S. PATENT DOCUMENTS

| | | | |
|---|---|---|---|
| 5,028,724 | A | 7/1991 | Ivankovits et al. |
| 6,110,529 | A | 8/2000 | Gardiner et al. |
| 6,126,996 | A | 10/2000 | Kirlin et al. |
| 6,258,157 | B1 | 7/2001 | Gordon |
| 6,482,740 | B2 | 11/2002 | Soininen et al. |
| 6,878,628 | B2 | 4/2005 | Sophie et al. |
| 6,921,712 | B2 | 7/2005 | Soininen et al. |
| 7,220,669 | B2 | 5/2007 | Hujanen et al. |
| 7,323,581 | B1 | 1/2008 | Gardiner et al. |
| 7,494,927 | B2 | 2/2009 | Kostamo et al. |
| 7,927,942 | B2 | 4/2011 | Raaijmakers |
| 8,142,847 | B2 | 3/2012 | Shenai-Khatkhate et al. |
| 8,188,464 | B2 | 5/2012 | Quick |
| 9,802,220 | B2 | 10/2017 | Heys et al. |
| 9,911,590 | B2 | 3/2018 | Dussarrat et al. |
| 10,131,984 | B2 | 11/2018 | Okada |
| 10,358,407 | B2 | 7/2019 | Hatanpaa et al. |
| 11,014,866 | B2 | 5/2021 | Hatanpaa et al. |
| 11,047,042 | B2 | 6/2021 | McKee et al. |
| 2003/0008072 | A1 | 1/2003 | Lee et al. |
| 2004/0043557 | A1 | 3/2004 | Haukka et al. |
| 2004/0224504 | A1 | 11/2004 | Gadgil |
| 2008/0102205 | A1 | 5/2008 | Barry et al. |
| 2013/0175665 | A1* | 7/2013 | Chudzik ............... H01L 21/84 257/532 |
| 2014/0141165 | A1 | 5/2014 | Sato et al. |
| 2015/0044853 | A1* | 2/2015 | Chudzik ............ H10B 12/0387 438/386 |
| 2015/0211112 | A1 | 7/2015 | Cadot et al. |
| 2016/0122868 | A1 | 5/2016 | Kim et al. |

FOREIGN PATENT DOCUMENTS

| | | |
|---|---|---|
| CN | 101500989 | 8/2009 |
| CN | 101982562 | 3/2011 |
| CN | 104561937 | 4/2015 |
| EP | 1983073 | 10/2008 |
| JP | 2004-507551 | 3/2004 |
| JP | 2009-542654 | 12/2009 |
| JP | 2011-246466 | 12/2011 |
| JP | 2012-99594 | 5/2012 |
| KR | 10-2008-0021709 | 3/2008 |
| KR | 10-2009-0007245 | 1/2009 |
| KR | 10-1464173 | 11/2014 |
| WO | WO 1996/40690 | 12/1996 |
| WO | WO 2002/18394 | 3/2002 |
| WO | WO 2008/002546 | 1/2008 |
| WO | WO 2010/114386 | 10/2010 |
| WO | WO 2015/016412 | 2/2015 |

OTHER PUBLICATIONS

Bonsu et al., "Synthesis and evaluation of κ2-β-diketonate and β-ketoesterate tungsten(VI) oxo-alkoxide complexes as precursors for chemical vapor deposition of WOx thin films", Dalton Trans., 2016, 45, pp. 10897-10908.

Browning et al., "Atomic layer deposition of MoS2 films", Mater. Res. Express 2, 2015, 6 pages.

Buono-Core et al., "Synthesis and evaluation of bis-β-diketonate dioxotungsten(VI) complexes as precursors for the photodeposition of WO3 films", Polyhedron, 30, 2011, pp. 201-206.

Chisholm et al., "The Molybdenum-Molybdenum Triple Bond. 13.1 Preparations and Characterization of Bis(P-diketonato)tetraalkoxydimolybdenum and -ditungsten Compounds", Inorg. Chem., 1984, 23, pp. 613-618.

Chisholm et al., "Reactions of Metal-Metal Multiple Bonds. 11.1 A Comparison of the Reactivity of M2(OR)6 (M=M) and M2(OR)4(R'COCHCOR')2 (M=M) Compounds (M=Mu, W) with the π-Acid Ligands CO, RC=CR, and RNC", Inorg. Chem., 1984, 23, pp. 1037-1042.

Chisholm et al., "Attempts to prepare W2(β-diketonate)4(M4-M) complexes by reductiye elimination fromd3 -d3 ditungsten complexes. Preparation and structures of W2 R 2(NMe2)2 (But -acac)2 and W2 R 2(OPri )2 (But -acac)2 compounds, whereR=Et, Ph, CH2Ph, and BCi", Journal of Cluster Science, Mar. 1994, vol. 5, Issue 1, pp. 67-82.

Doyle, "The Reaction of Some Molybdenum and Tungsten Halides with beta.-Diketones", Inorganic Chemistry, vol. 10, No. 10, 1971, pp. 2348-2350.

International Search Report and Written Opinion for International Application No. PCT/US2016/033955, Notification dated Oct. 18, 2016.

Kang et al., "High-mobility three-atom-thick semiconducting films with wafer-scale homogeneity", Nature, Apr. 30, 2015, vol. 520, pp. 656-660.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Mazurenko et al., "Synthesis, thermal stability, and IR and UV spectra of molybdenum and tungsten β-diketone complexes", Probl. Khim. Primen. β [Beta]-Diketonatov Met., (Mater. Vses. Semin.) (1982).

Zelazowlska et al., "WO3-based electrochromic system with hybrid organic-inorganic gel electrolytes", Journal of Non-Crystalline Solids, 354, 2008, pp. 4500-4505.

* cited by examiner

DEPOSITION OF HAFNIUM OXIDE WITHIN A HIGH ASPECT RATIO HOLE

REFERENCE TO RELATED APPLICATION

This application claims priority to U.S. Provisional Application No. 62/972,568, filed on Feb. 10, 2020, which is incorporated by reference herein in its entirety.

BACKGROUND

Field of the Invention

The present disclosure generally relates to hafnium oxide gap fill processes, including the formation of hafnium oxide within a high aspect ratio structure.

Description of the Related Art

Deposition of hafnium oxide within a high aspect ratio hole is useful in the field of semiconductor fabrication, for example in gap fill processes. Using methods such as atomic layer deposition (ALD), hafnium oxide can be deposited directly in three-dimensional structures, such as within a high aspect ratio hole. It has been noted that in depositing hafnium oxide in high aspect ratio structures, one or more undesirable voids in the hafnium oxide, also called a "seam", may develop. To address this, after depositing the hafnium oxide within the high aspect ratio hole, the substrate may be subjected to a rapid thermal processing (RTP) step, such as a rapid annealing process in which the deposited hafnium oxide is subjected to temperatures of 800° C. or above. While such treatments may reduce or eliminate the seam, small voids that resemble bubbles may form within the hafnium oxide. These voids may reduce the desired performance of the hafnium oxide layer. For instance, metal deposited after the RTP of the hafnium oxide may penetrate the hafnium oxide along the voids, which may lead to leakage issues. Without being bound to any theory, it is believed that one cause of the voids is that the hafnium oxide recrystallizes during the RTP.

SUMMARY

In some aspects, methods of depositing a hafnium oxide within a high aspect ratio hole in a substrate are provided. In some embodiments, the methods comprise depositing a first hafnium-containing layer comprising hafnium nitride or hafnium carbide layer in the high aspect ratio hole and converting the first hafnium-containing layer to a second hafnium-containing layer comprising hafnium oxide by contacting the first hafnium-containing layer with an oxygen reactant until at least a portion of the hafnium nitride or hafnium carbide of the first hafnium-containing layer has been converted to hafnium oxide. In some embodiments, the hafnium nitride or hafnium carbide is deposited by an atomic layer deposition (ALD) process. In some embodiments the oxygen reactant comprises one or more of ozone ($O_3$), molecular oxygen ($O_2$), water ($H_2O$), hydrogen peroxide ($H_2O_2$), or oxygen plasma. In some embodiments, the oxygen reactant comprises one or more of nitrogen monoxide (NO), nitrous oxide ($N_2O$), and nitrogen dioxide ($NO_2$). In some embodiments, an interlayer forms between the hafnium oxide and an unconverted portion of the hafnium nitride or hafnium carbide after contacting the first hafnium-containing layer with the oxygen reactant. In some embodiments, the first hafnium-containing layer is contacted with the oxygen reactant until the entire first hafnium-containing layer is converted to hafnium oxide.

In some embodiments, the first hafnium-containing layer is treated with an oxygen reactant at a temperature of about 500° C. to about 1200° C. In some embodiments, the first hafnium-containing layer is treated with an oxygen reactant for about 5 seconds to about 60 minutes. In some embodiments, the first hafnium-containing layer is treated with an oxygen reactant at a temperature of about 800° C. for a period of about 60 minutes. In some embodiments, the first hafnium-containing layer is treated with an oxygen reactant at a temperature of about 1100° C. for a period of about 10 seconds.

In some embodiments, the first hafnium-containing layer has a density higher than the density of the second hafnium-containing layer, thus, the volume of the second hafnium-containing layer becomes greater than the first hafnium-containing layer following treating the first hafnium-containing layer with oxygen reactant. In some embodiments, the thickness of the second hafnium-containing layer is about 1% to about 30% greater than the thickness of the first hafnium-containing layer prior to converting the first hafnium-containing layer to a second hafnium-containing layer. In some embodiments, the second hafnium-containing layer comprises a smaller number of voids or seams relative to a directly deposited hafnium oxide layer or a directly deposited hafnium oxide layer after a rapid thermal processing (RTP) step within the same high aspect ratio hole. In some embodiments, the second hafnium-containing layer comprises substantially no seams and no voids.

In some embodiments, the high aspect ratio hole comprises one or more wavy sidewalls. In some embodiments, the high aspect ratio hole comprises a narrow trench. In some embodiments, the high aspect ratio hole has an aspect ratio of about 2 to about 10000, about 2 to about 5000, about 5000 to about 10000, about 2 to about 1000, about 2 to about 100, or about 2 to about 10. In some embodiments the high aspect ratio hole has an aspect ratio of about 2 or greater, about 3 or greater, about 10 or greater, about 100 or greater, or about 1000 or greater, up to about 10000.

In some embodiments, the first hafnium-containing layer comprises hafnium nitride. In some embodiments, at least a portion of the hafnium nitride of the first hafnium-containing layer is converted to hafnium oxide after being contacted with an oxygen reactant. In some embodiments, an interlayer forms between the unconverted hafnium nitride and the hafnium oxide after contacting the first hafnium-containing layer with the oxygen reactant. In some embodiments, the interlayer comprises $HfN_xO_y$, wherein x and y are numerical values and can be integers or non-integers. In some embodiments, the thickness of the second hafnium-containing layer is about 1% to about 30% greater, or about 15% to about 25% greater than the thickness of the first hafnium-containing layer comprising hafnium nitride layer.

In some embodiments, the first hafnium-containing layer comprises a hafnium carbide. In some embodiments, the first hafnium-containing layer comprising hafnium carbide was contacted with an oxygen reactant. In some embodiments, the first hafnium-containing layer comprising hafnium carbide was exposed to air. In some embodiments the air exposure of the first hafnium-containing layer is carried out for a period of 1 minute to about 24 hours. In some embodiments, at least a portion of the hafnium carbide of the first hafnium-containing layer is converted to hafnium oxide after being contacted with an oxygen reactant or exposed to air. In some embodiments, an interlayer forms between the unconverted portion of hafnium carbide and the hafnium oxide after contacting the first hafnium-containing layer with the oxygen reactant or exposing the first hafnium-containing layer to air. In some embodiments, the interlayer comprises HfCxOy, wherein x and y are numerical values and can be integers or non-integers. In some embodiments, the thickness of the second hafnium-containing layer is about 1% to about 30% greater than the thickness of the first hafnium-containing layer.

DETAILED DESCRIPTION

Hafnium oxide is a useful material in the field of semiconductor fabrication. Hafnium oxide is understood to be a high-k dielectric that can be useful as a gate dielectric within semiconductor devices such as a metal-oxide-semiconductor (MOS) field effect transistors (FET). Three-dimensional transistor structures that use narrow fin structures are widely used within the industry. To form the narrow fin structures, material may be deposited within a high aspect ratio hole which may form a narrow trench. It is generally advantageous to deposit within the high aspect ratio hole without voids in the layer.

The present disclosure provides methods for forming hafnium oxide within a three-dimensional structure, such as in a high aspect ratio hole. In some embodiments the methods include depositing a first hafnium-containing material, such as hafnium nitride or hafnium carbide, in a three-dimensional structure and subsequently converting the first hafnium-containing material to a second hafnium-containing layer by treating the first hafnium-containing material with an oxygen reactant until at least a portion of the first hafnium-containing material is converted to a second hafnium-containing material comprising hafnium oxide. In some embodiments, the second hafnium-containing material comprises $HfO_2$. In some embodiments the second hafnium-containing material comprises hafnium and oxygen. In some embodiments the second hafnium-containing material comprises some nitrogen and/or carbon. In some embodiments the second hafnium-containing material comprises hafnium, oxygen and nitrogen. In some embodiments, the second hafnium-containing material comprises at least some $HfN_xO_y$ and/or $HfC_xO_y$, wherein x and y are numerical values and can be integers or non-integers. Expansion driven by a change from the first hafnium-containing material (hafnium nitride or hafnium carbide) to the second hafnium-containing material comprising hafnium and oxygen, for example comprising hafnium oxide, may increase the thickness of the layer and fill gaps or voids that may have been present in the first hafnium-containing material as deposited. That is, upon oxidation the hafnium-containing material expands relative to the first hafnium-containing material as deposited and voids or seams that may have been present upon deposition of the first hafnium-containing material may be filled by the expanded material.

Figure 1:
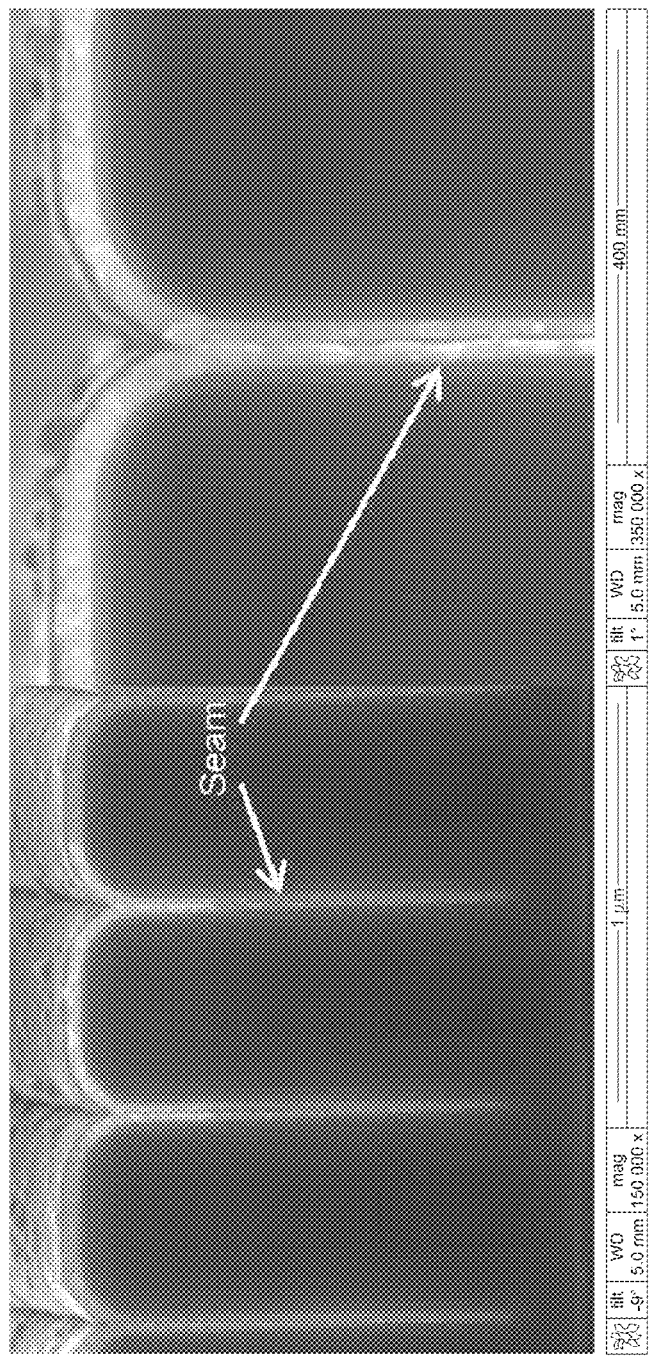
FIG. 1 is a scanning electron microscope (SEM) image of a seam formed after the deposition of a first hafnium-containing layer in a high aspect ratio hole.

In some embodiments a substrate comprising a layer with a three-dimensional structure, such as a high aspect ratio hole is provided. In some embodiments, the high aspect ratio hole has an aspect ratio of about 2 to about 10000, about 2 to about 5000, about 5000 to about 10000, about 2 to about 1000, about 2 to about 500, about 2 to about 100, about 2 to about 10, or about 2 to about 5. In some embodiments, the high aspect ratio hole has an aspect ratio of about 10 to about 10000, about 10 to about 5000, about 10 to about 1000, about 10 to about 500, about 10 to about 100, about 10 to about 50, or about 10 to about 25. In some embodiments the high aspect ratio hole has an aspect ratio of about 2 or greater, about 3 or greater, about 10 or greater, about 25 or greater, about 50 or greater, about 75 or greater, about 100 or greater, about 250 or greater, about 500 or greater, about 750 or greater, or about 1000 or greater, up to about 10000. In some embodiments, the high aspect ratio hole or structure comprises a narrow trench. A first layer of a first hafnium-containing material (first hafnium-containing layer) that is not hafnium oxide, such as hafnium nitride or hafnium carbide, is deposited in the structure. In some embodiments the first hafnium-containing layer is deposited by a vapor deposition process, such as by ALD. As is illustrated in FIG. 1, after the first hafnium-containing layer is deposited in a high aspect ratio hole, such as in a gap fill process, a seam may be present. In some embodiments, the deposition process is continued until the seam cannot be further narrowed. In some embodiments, one or more voids may be present in the first hafnium-containing layer.

The first hafnium-containing layer is subsequently converted to a second layer comprising a second hafnium-containing material (second hafnium-containing layer) by treatment with an oxygen reactant at a preselected temperature until at least a portion of the first hafnium-containing material of the first hafnium-containing layer has been converted to a second material comprising hafnium and oxygen. In some embodiments at least a portion of the first hafnium-containing layer is converted to a material comprising hafnium oxide. In some embodiments at least a portion of the first hafnium-containing layer is converted to $HfO_2$. In some embodiments, the material comprising hafnium and oxygen comprises $HfN_xO_y$ or $HfC_xO_y$, wherein x and y are numerical values and can be integers or non-integers. In some embodiments, the material comprising hafnium and oxygen is a metal oxide. In some embodiments, the material comprising hafnium and oxide is hafnium oxide. In some embodiment at least 10%, at least 20%, at least 30%, at least 40%, at least 50%, at least 60%, at least 70%, at least 80%, at least 90%, or 100% of the first hafnium-containing layer is converted to hafnium oxide. In some embodiments the first hafnium-containing layer is fully converted to hafnium oxide and thus the second hafnium-containing layer comprises substantially hafnium oxide. In some embodiments the second hafnium-containing layer consists essentially of hafnium oxide. In some embodiments, the hafnium oxide comprises $HfO_2$. In some embodiments only a portion of the first hafnium-containing layer is converted to $HfO_2$, leaving at least one of a portion of the unconverted first hafnium-containing layer or an intermediate material comprising hafnium and oxygen in the second hafnium-containing layer. In some embodiments, an interlayer may form between the hafnium oxide and the unconverted portion of the hafnium nitride or hafnium carbide. In some embodiments, the interlayer comprises $HfN_xO_y$ or $HfC_xO_y$, wherein x and y are numerical values and can be integers or non-integers.

In some embodiments, a seam present in the first hafnium-containing layer is reduced in the second hafnium-containing layer after treating the first hafnium-containing layer with the oxygen reactant. In some embodiments, the seam is not present in the second hafnium-containing layer after treating the first hafnium-containing layer with the oxygen reactant. In some embodiments, one or more voids present in the first hafnium-containing layer are reduced in the second hafnium-containing layer after treating the first hafnium-containing layer with the oxygen reactant. In some embodiments, there are less voids in the second hafnium-containing layer after treating the first hafnium-containing layer with the oxygen reactant relative to the number of voids in the first hafnium-containing layer prior to treatment. In some embodiments, there are less voids in the second hafnium-containing layer after treating the first hafnium-containing layer with the oxygen reactant relative to a directly deposited hafnium oxide within a hole having the same high aspect ratio after a rapid thermal processing (RTP) step. In some embodiments, the second hafnium-containing layer is substantially free of voids after treating the first hafnium-containing layer with the oxygen reactant.

In some embodiments, the oxygen reactant may comprise one or more of ozone ($O_3$), molecular oxygen ($O_2$), water ($H_2O$), hydrogen peroxide ($H_2O_2$), oxides of nitrogen, alcohols, or oxygen plasma. In some embodiments, the oxygen reactant comprises one or more oxides of nitrogen, such as nitrogen monoxide (NO), nitrous oxide ($N_2O$), or nitrogen dioxide ($NO_2$). In some embodiments, the oxygen reactant comprises one or more alcohols. In some embodiments the oxygen reactant comprises one or more organic alcohols, such as isopropyl alcohol. In some embodiments, the oxygen reactant comprises oxygen plasma, such as atomic oxygen, oxygen radicals, and/or excited oxygen species. In some embodiments the oxygen reactant does not include oxygen radicals. Thus, in some embodiments the conversion reaction is a thermal reaction and no plasma reactant is utilized. In some embodiments the oxygen reactant comprises oxygen radicals. Thus, in some embodiments a plasma is generated in an oxygen reactant, such as an oxygen-containing gas, and oxygen radicals are used to convert the first hafnium-containing layer to the second hafnium-containing layer comprising hafnium oxide.

In some embodiments the oxygen reactant includes $O_3$. In some embodiments, the oxygen reactant includes $O_2$. In some embodiments the oxygen reactant comprises $O_2$ and $O_3$. In some embodiments the oxygen reactant consists of $O_2$. In some embodiments the oxygen reactant consists of $O_3$.

In some embodiments the first hafnium-containing layer is heated while exposed to an oxygen reactant. The time of exposure to the oxygen reactant and the temperature are separately selected to achieve the desired level of conversion of the first hafnium-containing layer to a material comprising hafnium and oxygen. In some embodiments the first hafnium-containing layer is exposed to the oxygen reactant for about 1 second to about 30 seconds, for about 5 seconds to about 30 seconds, for about 5 seconds to about 60 seconds, for about 10 seconds to about 30 seconds, for about 1 second to about 60 seconds, for about 1 minute to about 5 minutes, for about 1 minute to about 30 minutes, for about 50 minutes to about 70 minutes, for about 50 minutes to about 100 minutes, for about 5 seconds to about 100 minutes, or for about 30 seconds to about 100 minutes. In some embodiments, the temperature is above the deposition temperature of the first hafnium-containing layer. In some embodiments the temperature is about 500° C. In some embodiments the temperature is about 1100° C. In some embodiments the temperature is about 500° C. to about 700° C., about 700° C. to about 900° C., about 500° C. to about 900° C., about 900° C. to about 1200° C., or about 500° C. to about 1200° C. In some embodiments the temperature is about 500° C. to about 1200° C. and the time of exposure to oxygen reactant is about is about 5 seconds to about 120 minutes. In some embodiments the temperature is about 800° C. to about 1100° C. and time of exposure to oxygen reactant is about 10 seconds to about 60 minutes. In some embodiments the temperature is about 800° C. and time of exposure to oxygen reactant is about 60 minutes. In some embodiments the temperature is about 1100° C. and time of exposure to oxygen reactant is about 10 seconds.

The first hafnium-containing layer may comprise a hafnium-containing material that is not hafnium oxide. In some embodiments, the hafnium-containing material has a density higher than the density of hafnium oxide. In some embodiments, the hafnium-containing material comprises hafnium nitride or hafnium carbide.

Figure 2D:
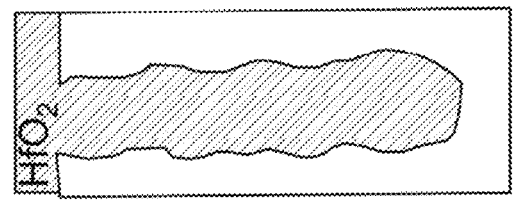
FIG. 2A-FIG. 2D are illustrations of the formation process of hafnium oxide substantially free of voids or seams in a high aspect ratio hole.
Figure 2C:
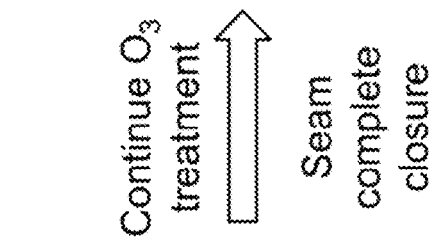
Figure 2C:
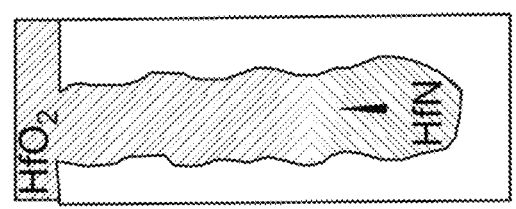

In some embodiments, the first hafnium-containing layer comprises hafnium nitride. FIG. 2 is an exemplary illustration of the mechanism and processes of the deposition of the hafnium oxide. Referring to FIG. 2 and according to some embodiments, at the step of FIG. 2A, a hafnium nitride layer is deposited in a three-dimensional structure, such as a trench, via or other high-aspect ratio hole. In some embodiments, the high aspect ratio hole has an aspect ratio of about 2 to about 10000, about 2 to about 5000, about 5000 to about 10000, about 2 to about 1000, about 2 to about 500, about 2 to about 100, about 2 to about 10, or about 2 to about 5. In some embodiments, the high aspect ratio hole has an aspect ratio of about 10 to about 10000, about 10 to about 5000, about 10 to about 1000, about 10 to about 500, about 10 to about 100, about 10 to about 50, or about 10 to about 25. In some embodiments the high aspect ratio hole has an aspect ratio of about 2 or greater, about 3 or greater, about 10 or greater, about 25 or greater, about 50 or greater, about 75 or greater, about 100 or greater, about 250 or greater, about 500 or greater, about 750 or greater, or about 1000 or greater, up to about 10000. The hafnium nitride may be deposited, for example, by an ALD process. In some embodiments the ALD process comprises one or more deposition cycles comprising contacting the substrate with a hafnium precursor and contacting the substrate with a nitrogen reactant. In some embodiments the hafnium precursor comprises hafnium halides, such as hafnium tetrachloride ($HfCl_4$). In some embodiments the hafnium precursor comprises Tetrakis(dimethylamido)hafnium (TDMAHf). In some embodiments the nitrogen reactant comprises ammonia ($NH_3$). In some embodiments the ALD deposition cycles may be repeated to form a hafnium nitride layer of the desired thickness. In some embodiments the deposited hafnium nitride layer has a good surface coverage. In some embodiments the deposition is continued until the three-dimensional hole such as the high aspect ratio hole is filled as completely as possible. In some embodiments the deposited hafnium nitride layer may not comprise visible seams or voids. As illustrated by FIG. 2A, in some embodiments one or more voids or seams may be formed when depositing the hafnium nitride in the three-dimensional structure.

Figure 2B:
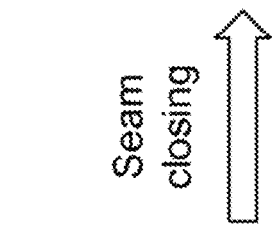
Figure 2B:
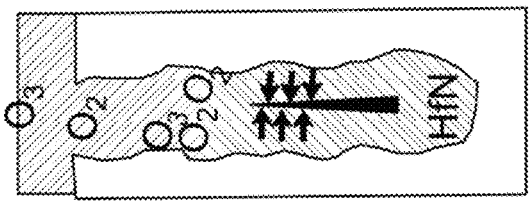
Figure 2A:
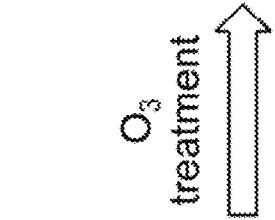
Figure 2A:
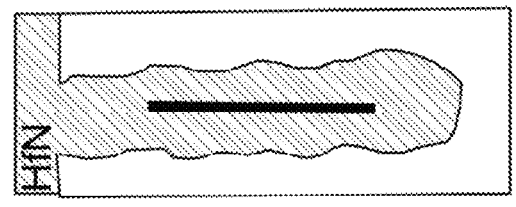

Referring to FIG. 2B and according to some embodiments, the deposited hafnium nitride is subsequently exposed to an oxygen reactant. In some embodiments the oxygen reactant comprises one or more of ozone ($O_3$), molecular oxygen ($O_2$), water ($H_2O$), hydrogen peroxide ($H_2O_2$), oxides of nitrogen, alcohols, or oxygen plasma. In some embodiments, the oxygen reactant comprises one or more oxides of nitrogen, such as one or more of nitrogen monoxide (NO), nitrous oxide ($N_2O$), or nitrogen dioxide ($NO_2$). In some embodiments, the oxygen reactant comprises one or more alcohols. In some embodiments the oxygen reactant comprises one or more organic alcohols, such as isopropyl alcohol. In some embodiments, the oxygen reactant comprises oxygen plasma, such as atomic oxygen, oxygen radicals, and/or excited oxygen species. In some embodiments the oxygen reactant does not include oxygen radicals. Thus, in some embodiments the conversion reaction is a thermal reaction and no plasma reactant is utilized. In some embodiments the oxygen reactant comprises oxygen radicals. Thus, in some embodiments a plasma is generated in an oxygen reactant and oxygen radicals are used to convert the first hafnium-containing layer to a second hafnium-containing layer comprising hafnium oxide. In some embodiments, the oxygen reactant is $O_2$. In some embodiments, the oxygen reactant is $O_3$. In some embodiments, the oxygen reactant comprises $O_2$ and $O_3$.

In some embodiments the deposited hafnium nitride is heated while exposed to an oxygen reactant. The time of exposure to the oxygen reactant and the temperature is selected to achieve the desired level of conversion of the hafnium nitride to hafnium oxide. In some embodiments the hafnium nitride is exposed to the oxygen reactant for about 1 second to about 30 seconds, for about 5 seconds to about 30 seconds, for about 5 seconds to about 60 seconds, for about 10 seconds to about 30 seconds, for about 1 second to about 60 seconds, for about 1 minute to about 5 minutes, for about 1 minute to about 30 minutes, for about 50 minutes to about 70 minutes, for about 50 minutes to about 100 minutes, for about 5 seconds to about 100 minutes, or for about 30 seconds to about 100 minutes. In some embodiments the temperature is about 500° C. In some embodiments the temperature is about 1100° C. In some embodiments the temperature is about 500° C. to about 700° C., about 700° C. to about 900° C., about 500° C. to about 900° C., about 900° C. to about 1200° C., or about 500° C. to about 1200° C. In some embodiments the temperature is about 500° C. to about 1200° C. and the time of exposure to oxygen reactant is about is about 5 seconds to about 120 minutes. In some embodiments the temperature is about 800° C. to about 1100° C. and time of exposure to oxygen reactant is about 10 seconds to about 60 minutes. In some embodiments the temperature is about 800° C. and time of exposure to oxygen reactant is about 60 minutes. In some embodiments the temperature is about 1100° C. and time of exposure to oxygen reactant is about 10 seconds.

In some embodiments the deposited hafnium nitride layer may be at least partially converted to hafnium oxide, for example $HfO_2$ after exposing the hafnium nitride to the oxygen reactant. In some embodiments, the hafnium nitride is partially converted to hafnium oxide, for example to $HfO_2$. In some embodiments the hafnium nitride is at least partially converted to a material comprising hafnium, nitrogen, and oxygen, for example $HfN_xO_y$. In some embodiments an interlayer may form between the $HfO_2$ and the unconverted HfN. In some embodiments the interlayer comprises hafnium oxynitride ($HfN_xO_y$). In some embodiments the thickness of the partially oxidized hafnium nitride layer is about 1% to about 30%, or about 15-25% more than the thickness of the hafnium nitride layer as deposited. In some embodiments the hafnium nitride may be almost fully converted to $HfO_2$ after exposing the hafnium nitride to the oxygen reactant.

In some embodiments following the treatment with the oxygen reactant to convert at least a portion of the hafnium nitride to the material comprising hafnium and oxygen, such as hafnium oxide, any voids or seams may be reduced or eliminated due to the expansion of the material. As is shown in FIG. 2C, in some embodiments the hafnium nitride has been partially converted to hafnium oxide and the voids or seams in the HfN layer are filled by the hafnium oxide due to its increased volume compared to hafnium nitride. As is illustrated in FIG. 2D and according to some embodiments the hafnium nitride has been completely converted to hafnium oxide and the hafnium oxide may be completely free of voids or seams.

In some embodiments a hafnium carbide layer is deposited in a three-dimensional structure, such as a trench, via or other high-aspect ratio hole. In some embodiments, the high aspect ratio hole has an aspect ratio of about 2 to about 10000, about 2 to about 5000, about 5000 to about 10000, about 2 to about 1000, about 2 to about 500, about 2 to about 100, about 2 to about 10, or about 2 to about 5. In some embodiments, the high aspect ratio hole has an aspect ratio of about 10 to about 10000, about 10 to about 5000, about 10 to about 1000, about 10 to about 500, about 10 to about 100, about 10 to about 50, or about 10 to about 25. In some embodiments the high aspect ratio hole has an aspect ratio of about 2 or greater, about 3 or greater, about 10 or greater, about 25 or greater, about 50 or greater, about 75 or greater, about 100 or greater, about 250 or greater, about 500 or greater, about 750 or greater, or about 1000 or greater, up to about 10000. The hafnium carbide may be deposited, for example, by an ALD process. In some embodiments the ALD process comprises alternately and sequentially contacting the substrate with a hafnium precursor and a second reactant that reacts with the hafnium precursor to form hafnium carbide. In some embodiments the hafnium precursor comprises hafnium tetrachloride. In some embodiments the ALD deposition cycles may be repeated to form a hafnium carbide film of the desired thickness. In some embodiments, when depositing the hafnium carbide one or more voids or seams may be formed.

In some embodiments the deposited hafnium carbide layer is subsequently exposed to an oxygen reactant at an elevated temperature. The time of exposure to the oxygen reactant and the temperature is selected to achieve the desired level of conversion of the hafnium carbide to hafnium oxide. In some embodiments the hafnium carbide is exposed to the oxygen reactant for about 1 second to about 30 seconds, for about 5 seconds to about 30 seconds, for about 5 seconds to about 60 seconds, for about 10 seconds to about 30 seconds, for about 1 second to about 60 seconds, for about 1 minute to about 5 minutes, for about 1 minute to about 30 minutes, for about 50 minutes to about 70 minutes, for about 50 minutes to about 100 minutes, for about 5 seconds to about 100 minutes, or for about 30 seconds to about 100 minutes. In some embodiments the hafnium carbide is heated above the deposition temperature. In some embodiments the temperature is about 500° C. In some embodiments the temperature is about 1100° C. In some embodiments the temperature is about 500° C. to about 700° C., about 700° C. to about 900° C., about 500° C. to about 900° C., about 900° C. to about 1200° C., or about 500° C. to about 1200° C. In some embodiments the temperature is about 500° C. to about 1200° C. and the time of exposure to oxygen reactant is about is about 5 seconds to about 120 minutes. In some embodiments the temperature is about 800° C. to about 1100° C. and time of exposure to oxygen reactant is about 10 seconds to about 60 minutes. In some embodiments the temperature is about 800° C. and time of exposure to oxygen reactant is about 60 minutes. In some embodiments the temperature is about 1100° C. and time of exposure to oxygen reactant is about 10 seconds.

In some embodiments, the oxygen reactant may comprise one or more of ozone ($O_3$), molecular oxygen ($O_2$), water ($H_2O$), hydrogen peroxide ($H_2O_2$), oxides of nitrogen, alcohols, or oxygen plasma. In some embodiments, the oxygen reactant comprises one or more oxides of nitrogen, such as one or more of nitrogen monoxide (NO), nitrous oxide ($N_2O$), or nitrogen dioxide ($NO_2$). In some embodiments, the oxygen reactant comprises one or more alcohols. In some embodiments the oxygen reactant comprises one or more organic alcohols, such as isopropyl alcohol. In some embodiments, the oxygen reactant comprises oxygen plasma, such as atomic oxygen, oxygen radicals, and/or excited oxygen species. In some embodiments the oxygen reactant does not include oxygen radicals. In some embodiments at least a portion of the hafnium carbide in the three-dimensional structure is converted to a material comprising hafnium and oxygen, such as hafnium oxide. In some embodiments, at least a portion of the hafnium carbide is converted to a material comprising hafnium, oxygen and carbon, such as $HfC_xO_y$, wherein x and y are numerical values and can be integers or non-integers. In some embodiments, an interlayer forms between the unconverted portion of hafnium carbide and the hafnium oxide after contacting the hafnium carbide layer with the oxygen reactant. In some embodiments, the interlayer comprises $HfC_xO_y$, wherein x and y are numerical values and can be integers or non-integers. In some embodiments following the treatment with the oxygen reactant to convert the hafnium carbide to hafnium oxide, any voids or seams may be reduced or eliminated due to the expansion of the material.

In some embodiments the deposited hafnium carbide layer is subsequently exposed to air at a temperature from about 10° C. to about 30° C., from about 10° C. to about 100° C., from about 100° C. to 500° C., from about 500° C. to about 1200° C., or from about 10° C. to about 1200° C. In some embodiments the hafnium carbide layer is exposed to air for about 1 minute to about 24 hours. In some embodiments at least a portion of the hafnium carbide layer in the three-dimensional structure is converted to a material comprising hafnium and oxygen, such as hafnium oxide, after air exposure. In some embodiments, at least a portion of the hafnium carbide layer is converted to a material comprising hafnium, oxygen and carbon, such as $HfC_xO_y$, after air exposure. In some embodiments, an interlayer forms between the unconverted hafnium carbide and the hafnium oxide after the air exposure. In some embodiments, the interlayer comprises $HfC_xO_y$, wherein x and y are numerical values and can be integers or non-integers. In some embodiments the thickness of the partially oxidized HfC layer is about 1% to about 30% greater than the thickness of the HfC layer as deposited. In some embodiments any voids or seams may be substantially reduced or eliminated due to the expansion of the material after air exposure.

In some embodiments the deposited hafnium carbide is first exposed to an oxygen reactant at an elevated temperature. The time of exposure to the oxygen reactant and the temperature is selected to achieve the desired level of conversion of the hafnium carbide to hafnium oxide. In some embodiments the hafnium carbide is exposed to the oxygen reactant for about 1 second to about 30 seconds, for about 5 seconds to about 30 seconds, for about 5 seconds to about 60 seconds, for about 10 seconds to about 30 seconds, for about 1 second to about 60 seconds, for about 1 minute to about 5 minutes, for about 1 minute to about 30 minutes, for about 50 minutes to about 70 minutes, for about 50 minutes to about 100 minutes, for about 5 seconds to about 100 minutes, or for about 30 seconds to about 100 minutes. In some embodiments the hafnium carbide is heated above the deposition temperature. In some embodiments the temperature is about 500° C. In some embodiments the temperature is about 1100° C. In some embodiments the temperature is about 500° C. to about 700° C., about 700° C. to about 900° C., about 500° C. to about 900° C., about 900° C. to about 1200° C., or about 500° C. to about 1200° C. In some embodiments the temperature is about 500° C. to about 1200° C. and the time of exposure to oxygen reactant is about is about 5 seconds to about 120 minutes. In some embodiments the temperature is about 800° C. to about 1100° C. and time of exposure to oxygen reactant is about 10 seconds to about 60 minutes. In some embodiments the temperature is about 800° C. and time of exposure to oxygen reactant is about 60 minutes. In some embodiments the temperature is about 1100° C. and time of exposure to oxygen reactant is about 10 seconds. In some embodiments the oxygen reactant may comprise one or more of ozone (03), molecular oxygen ($O_2$), water ($H_2O$), hydrogen peroxide ($H_2O_2$), oxides of nitrogen, alcohols, or oxygen plasma. In some embodiments, the oxygen reactant comprises one or more oxides of nitrogen, such as one or more of nitrogen monoxide (NO), nitrous oxide ($N_2O$), or nitrogen dioxide ($NO_2$). In some embodiments, the oxygen reactant comprises one or more alcohols, for example one or more organic alcohols, such as isopropyl alcohol. In some embodiments, the oxygen reactant comprises oxygen plasma, such as atomic oxygen, oxygen radicals, and excited oxygen species. In some embodiments the readily oxidized layer is further exposed to air. In some embodiments the layer is subsequently exposed to air for about 1 minute to about 24 hours. In some embodiments after air exposure, the thickness of the further oxidized HfC layer increases about 1% to about 30% comparing to the thickness of the oxidized HfC layer after contacting the deposited HfC layer to the oxygen reactant, but before the air exposure.

In some embodiments, the three-dimensional structure, such as a high aspect ratio hole, includes one or more wavy sidewalls. Wavy sidewalls typically make deposition of hafnium oxide within the high aspect ratio hole challenging. However, in some embodiments a first hafnium-containing layer is deposited and subsequently converted to a material comprising hafnium and oxygen by exposure to an oxygen reactant. For example, a hafnium nitride or hafnium carbide may be deposited and then treated with an oxygen reactant. At least a portion of the hafnium nitride or hafnium carbide may be converted to hafnium oxide. The conversion of the first hafnium-containing layer to hafnium oxide causes an expansion of the material such that the hafnium oxide fills the high aspect ratio hole without leaving significant gaps or voids.

Examples

Exemplary hafnium oxide was formed in a gap-fill process as described herein. A HfN film was deposited by ALD. The thickness of the as-deposited HfN film was 43.5 nm. After the HfN film was annealed in $O_2$ at about 800° C. for about an hour, the thickness of the film increased to 51.6 nm. After the HfN film was annealed in $O_2$ at about 1100° C. for 10 s, the thickness of the film increased to 50.7 nm. The HfN film was almost fully oxidized. A $HfN_xO_y$ interlayer formed between the hafnium oxide and hafnium nitride layer. The converted film had a composition of $HfN_{0.09}O_{1.44}$.

In another example, a HfC film was deposited by an ALD process. The thickness of the as-deposited HfC film was 94.4 Å. After exposing the HfC film to air for about 24 hours, the thickness of the film increased to 126 Å.

As used herein, the term "about" may refer to a value that is within 15%, within 10%, within 5%, or within 1% of a given value.

The term "layer" or "film" is used herein for simplicity. "Layer" or "film" is meant to mean any continuous or non-continuous structures and material deposited by the methods disclosed herein. For example, "layer" or "film" could include 2D materials, nanorods, nanotubes, nanoparticles, or even single, partial or full molecular layers, or partial or full atomic layers, or clusters of atoms and/or molecules. "Layer" or "film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of depositing a hafnium oxide within a high aspect ratio hole in a substrate, the method comprising:
   depositing a first hafnium-containing layer comprising hafnium nitride or hafnium carbide in the high aspect ratio hole; and
   converting the first hafnium-containing layer to a second hafnium-containing layer comprising hafnium oxide by contacting the first hafnium-containing layer with an oxygen reactant until at least a portion of the hafnium nitride or hafnium carbide of the first hafnium-containing layer has been converted to hafnium oxide.

2. The method of claim 1, wherein the second hafnium-containing layer comprises substantially no seams or voids.

3. The method of claim 1, wherein the oxygen reactant comprises one or more of ozone ($O_3$), molecular oxygen ($O_2$), water ($H_2O$), hydrogen peroxide ($H_2O_2$) or oxygen plasma.

4. The method of claim 1, wherein the oxygen reactant comprises one or more of nitrogen monoxide (NO), nitrous oxide ($N_2O$), and nitrogen dioxide ($NO_2$).

5. The method of claim 1, wherein contacting the first hafnium-containing layer with the oxygen reactant is carried out at a temperature of about 500° C. to about 1200° C.

6. The method of claim 1, wherein contacting the first hafnium-containing layer with the oxygen reactant is carried out for about 5 seconds to about 60 minutes.

7. The method of claim 1, wherein the first hafnium-containing layer is contacted with the oxygen reactant until the entire first hafnium-containing layer is converted to hafnium oxide.

8. The method of claim 1, wherein the high aspect ratio hole comprises one or more wavy sidewalls.

9. The method of claim 1, wherein the high aspect ratio hole has an aspect ratio of greater than about 3.

10. The method of claim 1, wherein the high aspect ratio hole has an aspect ratio of about 2 to about 1000.

11. The method of claim 1, wherein depositing the first hafnium-containing layer comprises an atomic layer deposition process.

12. The method of claim 1, wherein the volume of the second hafnium-containing layer is greater than the volume of the first hafnium-containing layer.

13. The method of claim 1, wherein the first hafnium-containing layer comprises hafnium nitride.

14. The method of claim 1, wherein the first hafnium-containing layer comprises hafnium carbide.

15. The method of claim 1, wherein an interlayer forms between the hafnium oxide and an unconverted portion of the hafnium nitride or hafnium carbide after contacting the first hafnium-containing layer with the oxygen reactant.

16. The method of claim 15, wherein the interlayer comprises $HfN_xO_y$, wherein x and y are numerical values and can be integers or non-integers.

17. The method of claim 15, wherein the interlayer comprises $HfC_xO_y$, wherein x and y are numerical values and can be integers or non-integers.

18. The method of claim 1, wherein the thickness of the second hafnium-containing layer is about 1% to about 30% greater than the thickness of the first hafnium-containing layer prior to converting the first hafnium-containing layer to a second hafnium-containing layer.

19. The method of claim 1, wherein contacting the first hafnium-containing layer with the oxygen reactant is carried out at a temperature of about 800° C. for a period of about 60 minutes.

20. The method of claim 1, wherein contacting the first hafnium-containing layer with the oxygen reactant is carried out at a temperature of about 1100° C. for a period of about 10 seconds.

* * * * *